(12) United States Patent
Cheng

(10) Patent No.: US 7,473,496 B2
(45) Date of Patent: Jan. 6, 2009

(54) METHOD FOR REPAIRING OPAQUE DEFECTS IN PHOTOLITHOGRAPHY MASKS

(75) Inventor: Chieh-Yuan Cheng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 825 days.

(21) Appl. No.: 10/982,302

(22) Filed: Nov. 4, 2004

(65) Prior Publication Data

US 2006/0093925 A1 May 4, 2006

(51) Int. Cl.
*G03F 1/08* (2006.01)
(52) U.S. Cl. .......................................................... 430/5
(58) Field of Classification Search ...................... 430/5
See application file for complete search history.

(56) References Cited

U.S. PATENT DOCUMENTS

| 5,429,730 | A | * | 7/1995 | Nakamura et al. | 430/5 |
| 6,090,507 | A | * | 7/2000 | Grenon et al. | 430/5 |
| 2002/0024011 | A1 | * | 2/2002 | Shimizu | 430/5 |

* cited by examiner

*Primary Examiner*—Mark F Huff
*Assistant Examiner*—John Ruggles
(74) *Attorney, Agent, or Firm*—Tung & Associates

(57) ABSTRACT

A method of repairing opaque defects on a photolithography mask avoids damage to the mask substrate while providing improved repair results. A chrome mask pattern is first covered with a layer of carbon, following which the entire mask is covered with a layer of photoresist. Portions of the photoresist are then etched away to expose the defect, while other portions remain covering the carbon. The defect is etched away while the carbon protects the adjacent areas of the chrome mask pattern. Following removal of the defect, the remaining areas of photoresist and carbon are then removed.

17 Claims, 5 Drawing Sheets

METHOD FOR REPAIRING OPAQUE DEFECTS IN PHOTOLITHOGRAPHY MASKS

FIELD OF THE INVENTION

This invention generally relates to masks used in photolithography processes to image circuit patterns onto a substrate, and deals more particularly with a method for repairing opaque defects present on the mask.

BACKGROUND OF THE INVENTION

Photolithography masks or "photomasks" are used extensively in the fabrication of integrated circuits on semiconductor wafers. Standard photomasks include a patterned light reflecting opaque layer or film on a transparent substrate. A metal, such as chromium, having a thickness on the order of about 1,000 angstroms is often used as the opaque layer or film, nickel and aluminum may also be used. Quartz is often used as the transparent substrate, though materials such as glass and sapphire can also be used. Features on the photomask can be as small as a few millionths of an inch. When the pattern is formed on the mask, typically by using computer control lasers or electron beam systems to expose the desired mask pattern in a photoresist material, it is not unusual for the mask to have defects. There are essentially two defect types, opaque and clear. Clear defects are areas where absorber is missing from areas that should be opaque; opaque defects are areas having absorber material deposited in the areas that should be clear. Since any defect in the photomask will ultimately be transferred to any semiconductor chip manufactured using that mask, these defects must be repaired before the mask can be used.

Because photomasks often have lines having a width of 0.3 mm with a width tolerance of about 10% or less, current repair techniques rely on the use of highly focus beams of photons or ions. Specifically, opaque defect repair currently involves laser evaporation or ablation or focused ion beam (FIB) sputtering of unwanted chromium in defect regions. However because the resolution of a laser is limited, if the opaque defect is connected to an adjacent chromium line, laser ablation may damage the adjacent line, removing some wanted chromium from the line. In addition, because a great deal of thermal energy is transmitted with a laser beam, the laser ablation step not only melts and vaporizes the unwanted metal defect region, but also may damage and remove a layer of the quartz underlying an adjacent opaque defect, producing roughness in the quartz. This damaged region of the quartz reduces transmission and alters the phase of the light transmitted through the mask.

As an alternative to laser ablation, FIB offers a controlled process for sputtering a small region of unwanted material. The ion beam can be focused to a much smaller size than a laser beam. In addition, the ion beam physically sputters material, transferring less thermal energy to the mask, although some damage to the quartz substrate may nevertheless occur.

FIB suffers from a number of other problems. First, because a mask is formed on a quartz substrate which is an insulating material, the ion beam rapidly changes the surface and both the ability to aim subsequent ions and to use the ion beam to image the results is degraded. Second, while an opaque defect is being removed, quartz at the edge of the defect is attacked at the same rate, and the result is a "riverbed" or trench of damaged quartz around the defect, the quartz in this region having altered transmission and phase. Third, the FIB species is typically gallium and gallium has been found implanted into the quartz when the opaque defect is removed, causing transmission losses. Finally, sputtering of material by the ion beam leads to ejection of materials in all directions and some of this ejected material comes to rest on adjacent edges.

In order to minimize some of the undesirable effects of the FIB process discussed above, a multi-step process has been used in which a rough repair is first made using FIB, following which the mask is cleaned using NaOH. Then, fine repair is made on the defect, again using an FIB process. Commercial equipment for carrying out these types of FIB repairs is commercially available from companies such as Seiko and Micrion. Following the fine repair, the mask is cleaned again with NaOH using an inductively coupled plasma, following which the defect is inspected using suitable equipment such as a microlithography simulation microscope. Nevertheless, this multi-step process often results in excessive material removal or removal of wanted material along the lines that are adjacent to the opaque defect.

Clearly, it would be desirable to provide a method for repairing opaque defects that avoids the problems associated with current techniques discussed above. The present invention is directed to solving these problems.

SUMMARY OF THE INVENTION

In accordance with one aspect of the invention, a method is provided for repairing opaque defects present on the surface of a photolithography mask, comprising the steps of depositing a protective layer of etch resistant material over an opaque, feature defining metal pattern on the mask substrate; etching away the opaque defect, the protective layer protecting the metal pattern during etching of the defect; and removing the protective layer. The protective layer is preferably carbon or a carbon based material that may be subsequently removed by laser vaporization or plasma etching. The etch resistant material is preferably deposited over the metal pattern using a focused ion beam. The method further includes depositing a layer of photoresist over the protective carbon layer and over the defect. Following deposit of the photoresist layer, portions of the photoresist are removed to reveal the defect. With the metal pattern being protected by overlying layers of carbon and photoresist, the exposed opaque defect is removed by dry etching, following which the photoresist is removed as by wet etching. The final step comprises removing the protective carbon layer.

According to another aspect of the invention, a method of repairing opaque defects present on a photolithography mask defined by a metal pattern formed on a quartz substrate, comprises the steps of: depositing a protective layer of carbon on the metal pattern such that the defect remains exposed; applying a layer of photoresist over the protective carbon layer and over the defect; removing the portion of the photoresist that covers the defect in order to expose the defect; etching away the defect; removing the remaining portions of the photoresist and then removing the protective carbon layer. The portion of the photoresist covering the opaque defect is preferably removed by vaporizing the photoresist using a laser beam. The remaining photoresist is preferably removed using wet etching techniques. The protective carbon layer may be removed using either a laser used to vaporize the carbon, or by plasma etching.

Accordingly, a primary object of the present invention is to provide a method of removing opaque defects from photolithography masks which substantially reduces the possibility of damaging the quartz mask substrate or removing wanted areas of the metal mask pattern adjoining the defect.

Another object of the invention is to provide a method as described above which uses existing, commonly used semiconductor processing techniques and equipment.

A further object of the invention is to provide a method as described above which improves the accuracy with which the opaque defect is removed.

A still further object of the invention is to provide a method of repairing opaque defects which avoids the use of focused ion beam etching processes to remove the defect.

These, and further objects and advantages of the invention will be made clear or will become apparent during the course of the following description of a preferred embodiment of the invention.

BRIEF DESCRIPTION OF THE DRAWINGS

In the drawings, which form an integral part of the specification and are to be read in conjunction therewith, and in which like reference numerals are employed to designate identical components in the various views.

DETAILED DESCRIPTION OF THE PREFERRED EMBODIMENTS

Figure 2:
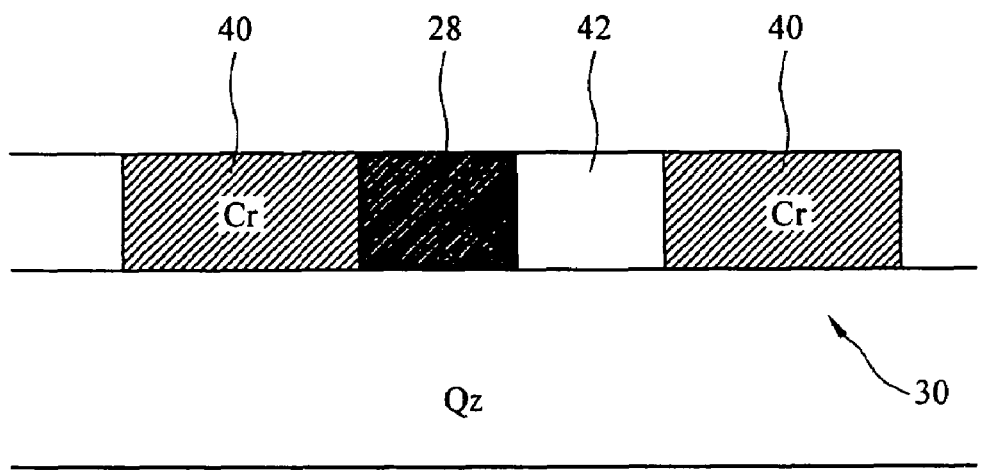
FIGS. 2-8 are fragmentary, cross-sectional views of a portion of a mask, depicting successive processing steps of the inventive method for repairing opaque defects.

Referring first to FIG. 2, a photolithography imaging mask includes a substrate 30 formed of quartz, glass, sapphire or other transparent material, having a pattern of metallization 40 formed thereon which defines an opaque mask having openings 42 through which radiant energy may pass to form an image on a wafer surface. The patterned metallization 40 may comprise chromium, aluminum or other suitable metal. An opaque defect 28 is shown adjacent the metallization pattern 40, which may comprise either an unwanted, out-of-tolerance portion of the metallization itself, or a foreign material deposited onto the substrate 30 during the mask making process.

Figure 1:
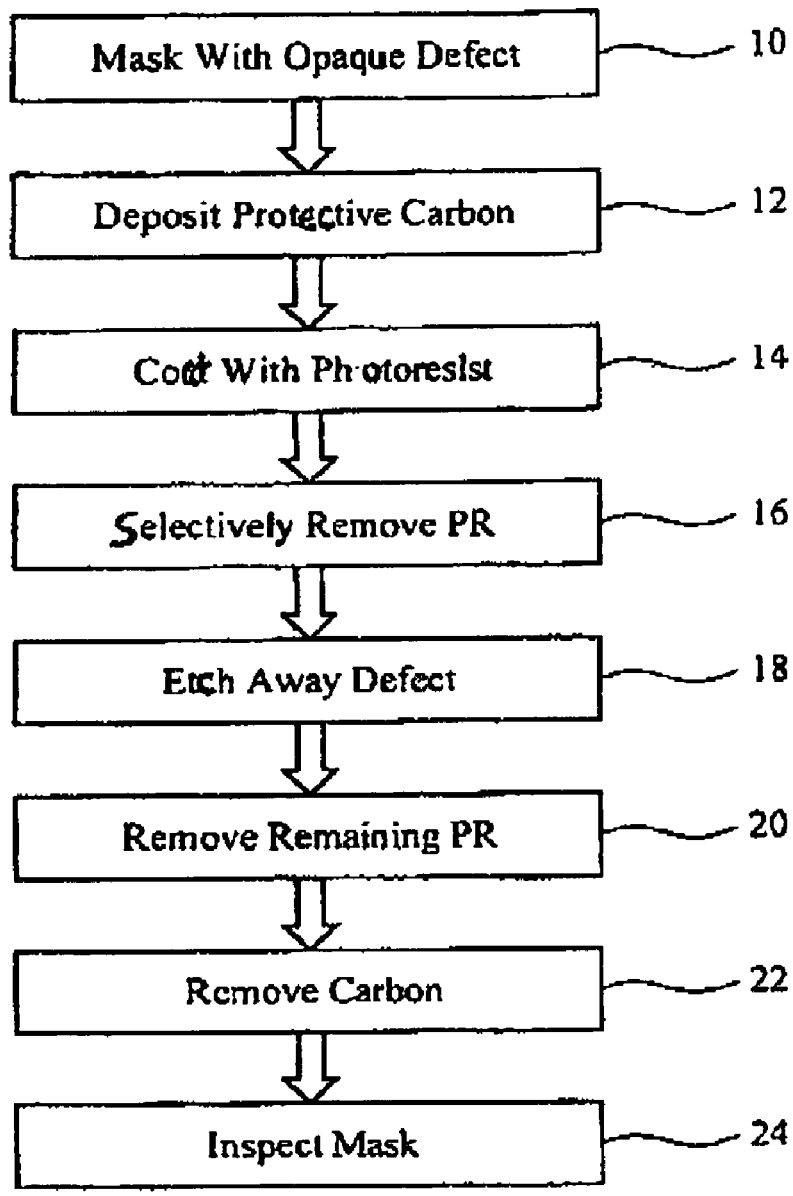
FIG. 1 is a flow chart showing the steps of the method forming the preferred embodiment of the invention.

Referring also now to FIG. 1, the method of removing the opaque defect 28 briefly comprises the following steps. Beginning with the mask having the defect in step 10, a protective layer of material such as carbon or carbon based material is deposited over the metallization 40, in the areas immediately surrounding the defect 28.

Following deposition of the protective carbon layer step 12 the entire mask is coated with a photoresist at step 14. Next, at step 16, a portion of the photoresist is removed in order to expose the defect 28. At step 18, the defect is etched away, following which the remaining portions of the photoresist are removed at step 20. Then, the protective layer of carbon is removed at step 22, and the mask is inspected at step 24.

Figure 3:
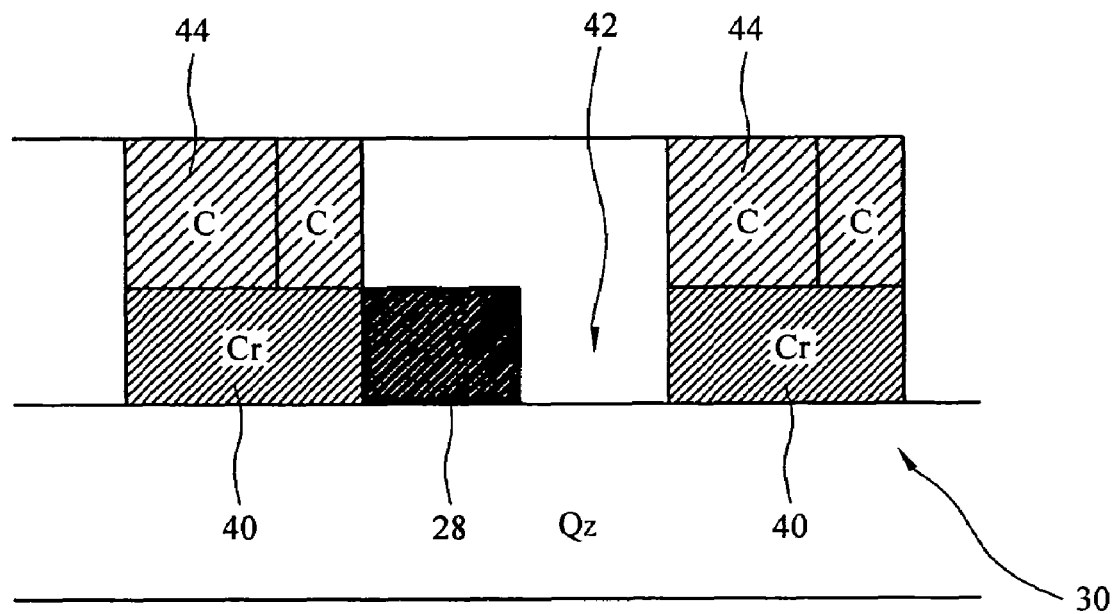

FIG. 3 shows the protective layer of carbon 44 having been deposited over those areas of the metallization 40 immediately adjacent or surrounding the opaque defect 28. Although carbon or a carbon based material is the preferred material for the protective layer 44, other suitable materials may be employed as well, providing they protect the metallization 40 when the defect 28 is etched away. Any of various techniques may be employed to deposit the protective layer 44 of carbon, such as carbon deposition using a focused ion beam (FIB) which can be carried out using equipment such as Micrion model 9000.

Figure 4:
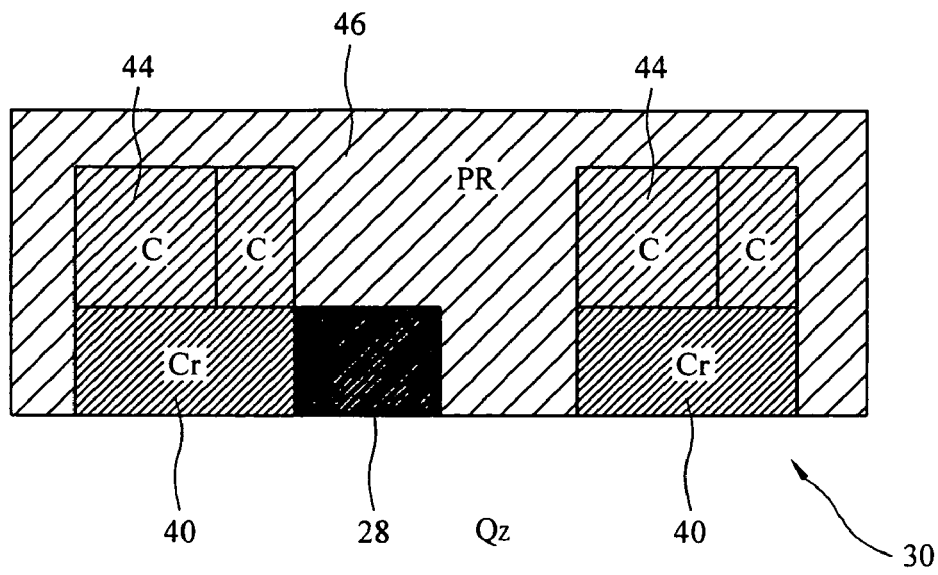
Figure 5:
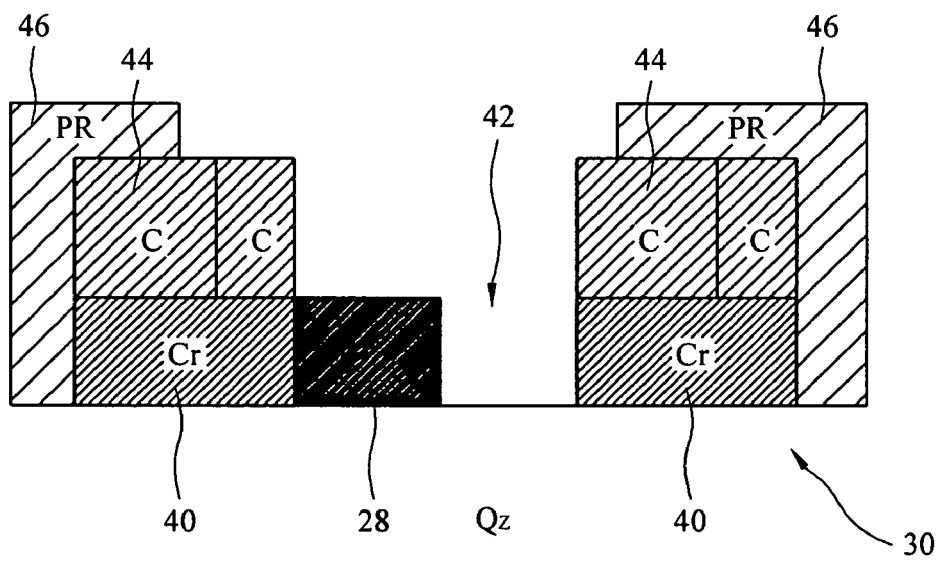

The protective carbon layer 44 having been deposited, a layer of photoresist 46 is then deposited over at least the area of the mask where the defect 28 is located, which is shown in FIG. 4. As shown in FIG. 5, a portion of the photoresist is removed in order to expose the defect 28, the remaining portion of the photoresist layer remaining in place to protectively cover the metallization pattern 40. The portion of the photoresist 46 covering the defect 28 may be removed by vaporizing the photoresist using a laser beam or a similar energy, for example, from a laser repair machine manufactured by the NEC corporation.

The opaque defect 28 having been exposed, the surface of the mask is subjected to a dry etching process which may comprise plasma etching, ion milling or reactive ion etching, for example. During this dry etching process, the protective layer of carbon 44 covers and protects the metallization 40.

Figure 6:
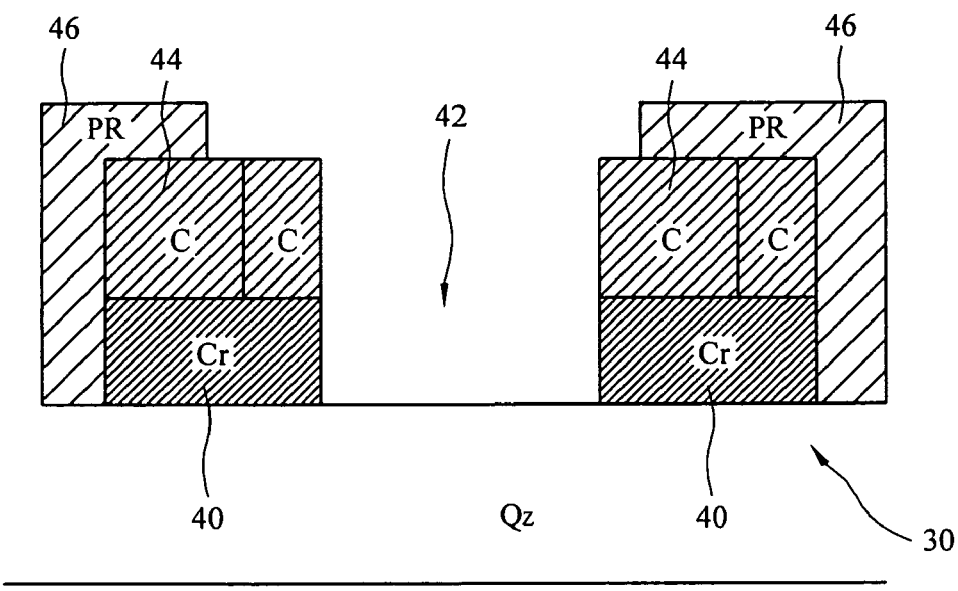

With the opaque defect 28 having been removed as shown in FIG. 6, the next step consists of removing those remaining portions of the photoresist 46 shown in FIG. 6. The remaining photoresist 46 shown in FIG. 6 is preferably removed using a wet etch process in which the photoresist is subjected to a solution of $H_2SO_4+H_2O_2$, or other suitable wet etching medium.

Figure 7:
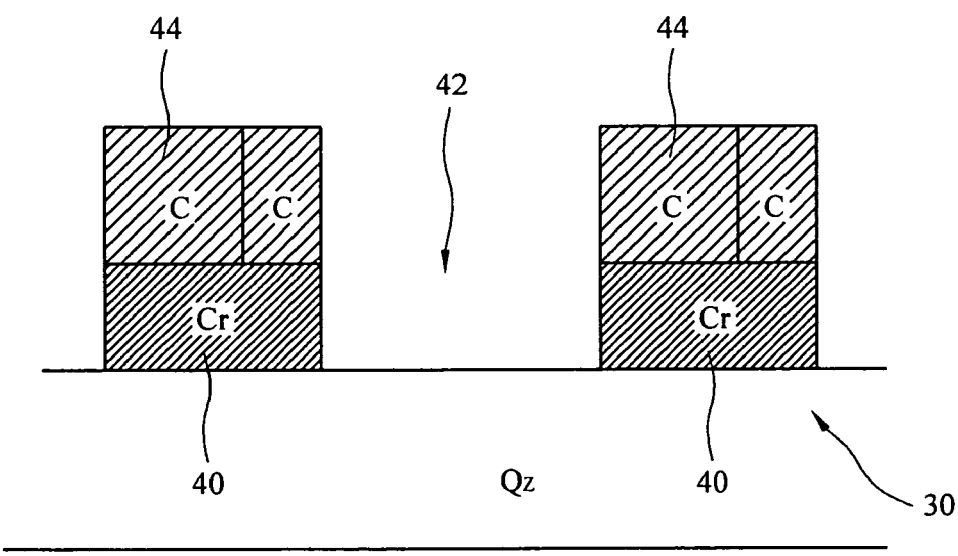

Following the wet etching step, the mask is in the condition shown in FIG. 7, wherein the photoresist 46 has been completely removed, and there remains only the protective carbon layer 44 overlying the metallization pattern 40. Depending upon the material chosen for the protective layer 44, any of a number processes may be employed to remove the protective layer 44, such as using a laser to burn off the material 44. Alternatively, for example, the protective layer 44 can be removed by conventional plasma etching techniques.

Figure 8:
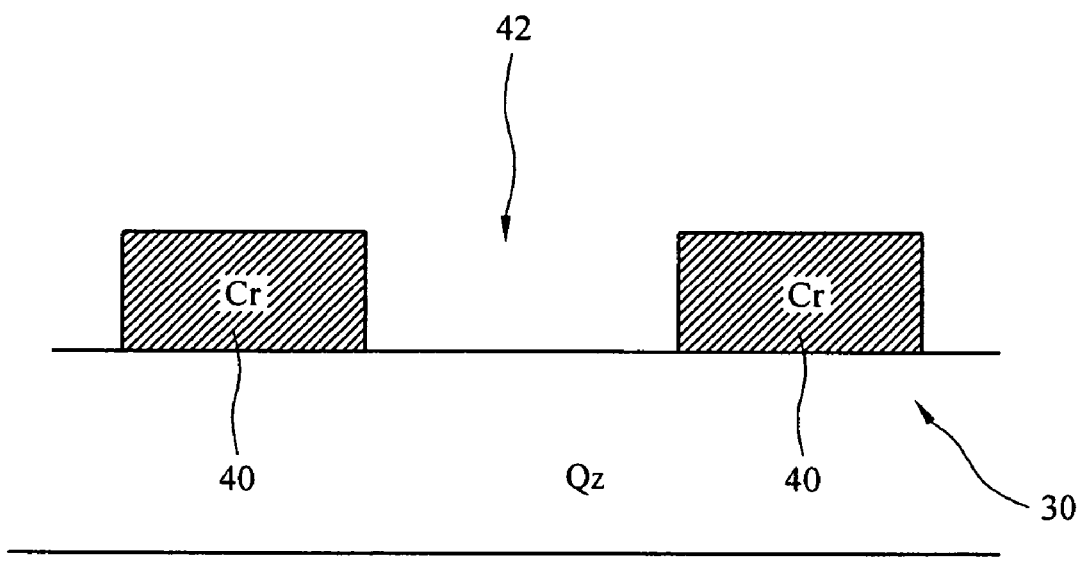

Following removal of the protective carbon layer 44, the mask is in its repaired condition as shown in FIG. 8, with the opaque defect 28 having been removed as well as all portions of the photoresist 46 and the protective layer carbon 44. At this point, the mask is normally subjected to a detailed inspection to assure that the defects have been fully and properly removed. This may be accomplished by using, for example, a microlithography simulation microscope, or similar equipment.

From the forgoing, it is apparent that the novel method of repairing opaque defects in photolithography masks not only provides for the reliable accomplishment of the objects of the invention but does so in a particularly simple and economical manner. Those skilled in the art will recognize that various modifications may be made to the embodiment chosen to illustrate the invention without departing from the spirit and scope of the present contribution of the art. Accordingly, it is to be understood that the protection sought and to be afforded hereby should be deemed to extend to the subject matter claimed and all equivalents thereof fairly within the scope of the invention.

What is claimed is:

1. A method of repairing opaque defects present on a photolithography mask, comprising the steps of:

depositing a protective layer of carbon as an etch resistant material over an opaque, feature-defining metal pattern on the mask substrate, said protective carbon layer deposited such that an opaque defect comprising said metal pattern remains exposed;

depositing a layer of photoresist on the protective carbon layer and over the opaque defect;

removing a portion of the photoresist covering the opaque defect to thereby expose the opaque defect, said protective layer of carbon remaining on the metal pattern;

etching away the opaque defect, the protective layer protecting the metal pattern during etching of the defect; and, removing the protective carbon layer.

2. The method of claim 1, wherein the protective carbon layer is formed using a focused ion beam and a source of precursor gas.

3. The method of claim 1, wherein the mask substrate includes quartz.

4. The method of claim 1, wherein the protective carbon layer is removed by vaporizing the photoresist portion using an energy beam.

5. The method of claim 1, wherein the opaque defect is removed by dry etching the opaque defect.

6. The method of claim 1, further including the step of removing the photoresist remaining following etching away the opaque defect.

7. The method of claim 6, wherein the photoresist is removed by wet etching the photoresist.

8. The method of claim 1, wherein the protective carbon layer is removed by vaporizing the protective layer using an energy beam.

9. The method of claim 1, wherein the protective carbon layer is removed using a plasma.

10. A method of repairing opaque defects present on a photolithography mask defined by a metal pattern formed on a quartz substrate, comprising the steps of:

(A) depositing a protective layer of carbon on the metal pattern, such that the defect remains exposed;

(B) applying a layer of photoresist on the protective layer of carbon, and over the defect;

(C) removing a portion of the photoresist covering the defect to thereby expose the defect, said protective layer of carbon remaining on the metal pattern;

(D) etching away the defect, the carbon layer preventing damage to the metal pattern during the etching;

(E) removing remaining portions of the photoresist; and, (F) removing the protective carbon layer.

11. The method of claim 10, wherein steps (A)-(F) are performed successively.

12. The method of claim 10, wherein step (C) is performed by vaporizing the photoresist covering the defect.

13. The method of claim 12, wherein the vaporization is performed using a laser.

14. The method of claim 10, wherein step (D) is performed using dry etching.

15. The method of claim 10, wherein step (E) is performed by wet etching the photoresist.

16. The method of claim 10, wherein step (F) is performed by laser burning the carbon layer.

17. The method of claim 10, wherein the metal is chromium.

* * * * *